(12) United States Patent
McAdam et al.

(10) Patent No.: US 7,679,448 B1
(45) Date of Patent: Mar. 16, 2010

(54) CONTINUOUS WAVE BASED BIAS METHOD AND APPARATUS FOR MINIMIZING MOS TRANSISTOR DISTORTION

(75) Inventors: Matthew W. McAdam, Vancouver (CA); Francis Beaudoin, Brossard (CA)

(73) Assignee: PMC-Sierra, Inc., Santa Clara, CA (US)

( * ) Notice: Subject to any disclaimer, the term of this patent is extended or adjusted under 35 U.S.C. 154(b) by 226 days.

(21) Appl. No.: 11/847,535

(22) Filed: Aug. 30, 2007

(51) Int. Cl.
*H03G 3/10* (2006.01)
(52) U.S. Cl. .................. 330/285; 330/296; 330/149
(58) Field of Classification Search .......... 330/285, 330/296, 149
See application file for complete search history.

(56) References Cited

U.S. PATENT DOCUMENTS

| | | | |
|---|---|---|---|
| 6,081,159 A * | 6/2000 | Kim et al. | 330/149 |
| 6,348,834 B1 | 2/2002 | Brown | |
| 6,445,474 B1 * | 9/2002 | Dubos et al. | 398/141 |
| 6,531,924 B2 | 3/2003 | Aparin | |
| 7,084,705 B2 | 8/2006 | Prodanov | |
| 7,157,971 B2 * | 1/2007 | Groe | 330/259 |
| 7,245,890 B2 * | 7/2007 | Kumagawa et al. | 455/130 |
| 7,508,266 B1 * | 3/2009 | Hissen et al. | 330/285 |

OTHER PUBLICATIONS

Kim et al., "A Cellular-Band CDMA 0.25um CMOS LNA Linearized Using Active Post-Distortion", Journal of Solid-State Circuits, vol. 41, No. 7, Jul. 2006, pp. 1530-1534.

* cited by examiner

*Primary Examiner*—Patricia Nguyen
(74) *Attorney, Agent, or Firm*—Curtis B. Behmann; Borden Ladner Gervais LLP

(57) ABSTRACT

A biasing circuit and method for minimizing distortion in a MOS transistor. A first CW source provides a first CW signal at the input of a replica transistor to obtain an output signal at the output of the replica transistor. The output signal is mixed with another CW signal having a frequency equal to N times that of the first CW signal, N being an integer greater than one, to obtain a mixed signal having a DC component with an intensity proportional to the $N^{th}$-order distortion present in the output signal. A bias voltage to minimize this distortion is then applied to the input of the original transistor on which the replica transistor is based, the bias voltage determined in accordance with the intensity of the DC component.

20 Claims, 7 Drawing Sheets

CONTINUOUS WAVE BASED BIAS METHOD AND APPARATUS FOR MINIMIZING MOS TRANSISTOR DISTORTION

FIELD OF THE INVENTION

The present invention relates generally to transistor circuits. More particularly, the present invention relates to the control of distortion in metal-oxide-semiconductor transistor circuits.

BACKGROUND OF THE INVENTION

Transistor amplifiers are commonly used building blocks of analog circuits operating at frequencies ranging from audio to radio frequencies (RF). Generally, these circuits are required to produce minimal distortion of the signal they operate on to preserve information carried by the signal. In circuits that implement feedback, a designer has the option to reduce distortion by controlling the loop gain of the circuit at the expense of overall gain. In feed-forward circuits however, other means of improving linearity, i.e., reducing distortion, are required.

As an example, RF circuits are a common application in which one faces these issues. An RF designer is typically compelled to use feed-forward architectures due to the high frequency of operation. The designer must also consider linearity in systems where the modulation scheme is a non-constant envelope, i.e., where there is amplitude variation between the various symbols. Non-constant envelope modulation schemes (e.g., 64-QAM) are becoming more and more prevalent as system designers seek to achieve greater rates of data transmission. Put simply, designing a circuit with sufficient linearity performance is often one of the greatest challenges in RF design.

Compensation for non-linearities and signal distortion in transistor circuits is known. For example, U.S. Pat. No. 6,531,924 discloses biasing circuits that selectively compensate for second or third order distortion. In this reference, mathematical models for the second order transconductance and the third order transconductance of a given transistor are developed for small deviations of voltages and currents. Based on these models, biasing circuits using direct current operation and comprising an operational amplifier, current mirrors and replica transistors of the transistor in which the transconductance is to be cancelled are designed. The large number of components required in making such biasing circuits and the fact that space available on a circuit die is usually quite limited, can lead to circuit layout problems.

Active biasing of power devices for linear operation is also known. For example, U.S. Pat. No. 7,084,705 to Prodanov discloses biasing circuits for Class-AB power amplifiers. These biasing circuits aim at maintaining a fixed ratio of an operating point transconductance to a maximum transconductance over a broad range of temperatures. This is achieved by measuring transconductance at extreme bias points to determine the bias point; however, the Prodanov approach does not lead to canceling specific $N^{th}$-order distortion.

It is, therefore, desirable to provide an approach that requires relatively few circuit components and allows cancellation of specific distortion orders.

SUMMARY OF THE INVENTION

It is an object of the present invention to obviate or mitigate at least one disadvantage of previous biasing schemes for minimizing distortion in transistor circuits.

In a first aspect, the present invention provides a A biasing circuit for varying distortion in a first transistor. The biasing circuit comprises a replica of the first transistor and a first continuous wave (CW) source for providing a first CW signal at an input of the replica transistor to obtain an output signal at an output of the replica transistor, the first CW signal having a frequency $f_o$, the output signal having an Nth-order distortion component at a frequency $N^*f_o$, N being an integer greater than one. The biasing circuit also comprises a second CW source for generating a second CW signal having a frequency $N^*f_o$, a mixer for mixing the output signal with the second CW signal to obtain a mixed signal having a DC component with an intensity proportional to a value of the Nth-order distortion component; and a bias controller for receiving the mixed signal and for biasing the input of the first transistor in accordance with the value of the Nth-order distortion component.

In a second aspect, there is provided a method of setting a bias voltage in a transistor circuit. The method comprises steps of, in a replica transistor circuit of the transistor circuit, applying a CW signal at an input of the replica transistor circuit to obtain an output signal at an output of the replica transistor circuit, the CW signal having a frequency $f_o$, and determining, at the output of the replica transistor circuit, a value of an Nth-order distortion component of the output signal, the Nth-order distortion component being at a frequency equal to $N^*f_o$, N being an integer greater than one. The method also comprises a step of, in the transistor circuit, applying a bias voltage at an input of the transistor circuit in accordance with the value of the Nth-order distortion component.

In a third aspect, the present invention provides a method for varying distortion in a transistor. The method comprises steps of applying a CW signal at an input of the transistor to obtain an output signal at an output of the transistor, the CW signal having a frequency $f_o$, determining, at the output of the transistor, a value of an Nth-order distortion component of the output signal, the Nth-order distortion component being at a frequency equal to $N^*f_o$, N being an integer greater than one, and applying a bias voltage at the input of the transistor in accordance with the value of the Nth-order distortion component.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and biasing circuit for minimizing $N^{th}$-order distortion in a first transistor circuit by adjusting the bias at the input of the first transistor circuit. A first CW signal having a fixed frequency $f_o$ is provided at the input of a replica transistor circuit of the first transistor circuit to obtain an output signal at the output of the replica transistor circuit. The output signal is mixed with another CW signal having a frequency equal to $N*f_o$. The resulting mixed signal includes a DC component having an intensity proportional to the $N^{th}$-order distortion present in the output signal. A feedback circuit adjusts the bias at the input of the replica transistor circuit, and at the input of the first transistor circuit, to minimize the DC component of the mixed signal.

The following describes embodiments of the invention for metal-oxide-semiconductor transistors; however, as will be understood by the worker skilled in the art, the present invention is also applicable to other types of transistor devices such as, for example, BJTs, MESFETs etc.

Figure 1:
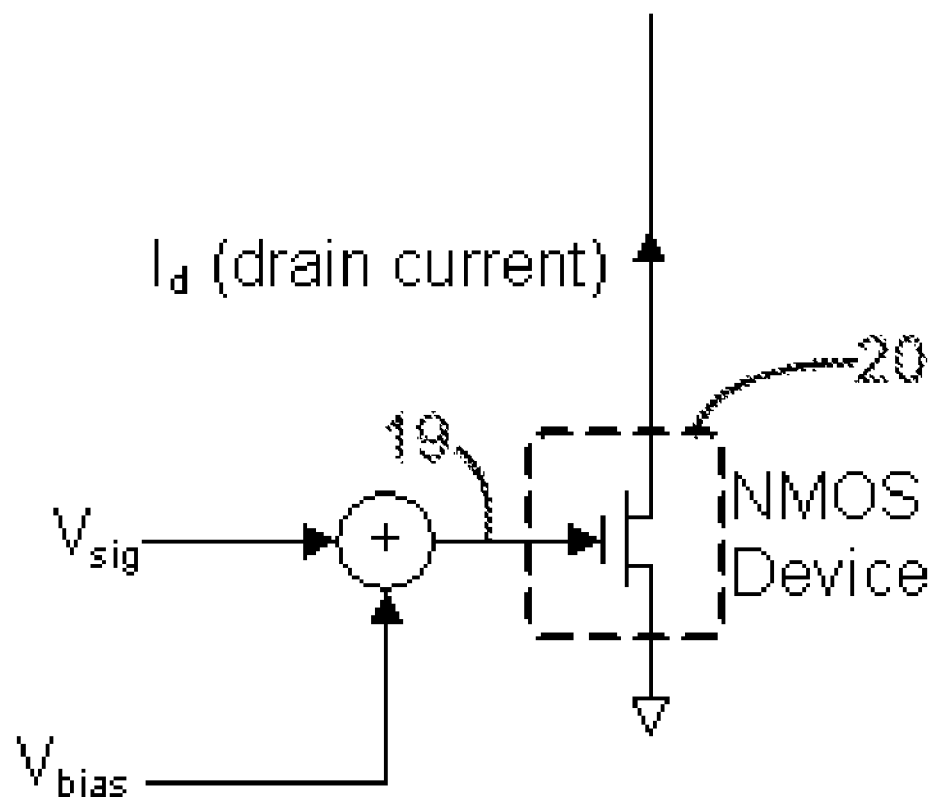
FIG. 1 shows a plot of transconductance as a function of voltage for a typical MOS device.

FIG. 1 shows an NMOS transistor 20 in common source configuration. There, $V_{sig}$ represents the voltage signal to be amplified/processed/filtered, and $V_{bias}$ represents a DC bias voltage for the transistor. The sum of $V_{sig}$ and $V_{bias}$, applied to the gate 19, is equal to $V_{gs}$ for the NMOS transistor 20, with $V_{sig}$ being the AC portion of the signal and $V_{bias}$ the DC portion. The drain current $I_d$ is a function of both $V_{gs}$ and of the transconductance $g_m$, which leads, as explained below, to non-linearities in the output signal $I_d$.

Figure 2:
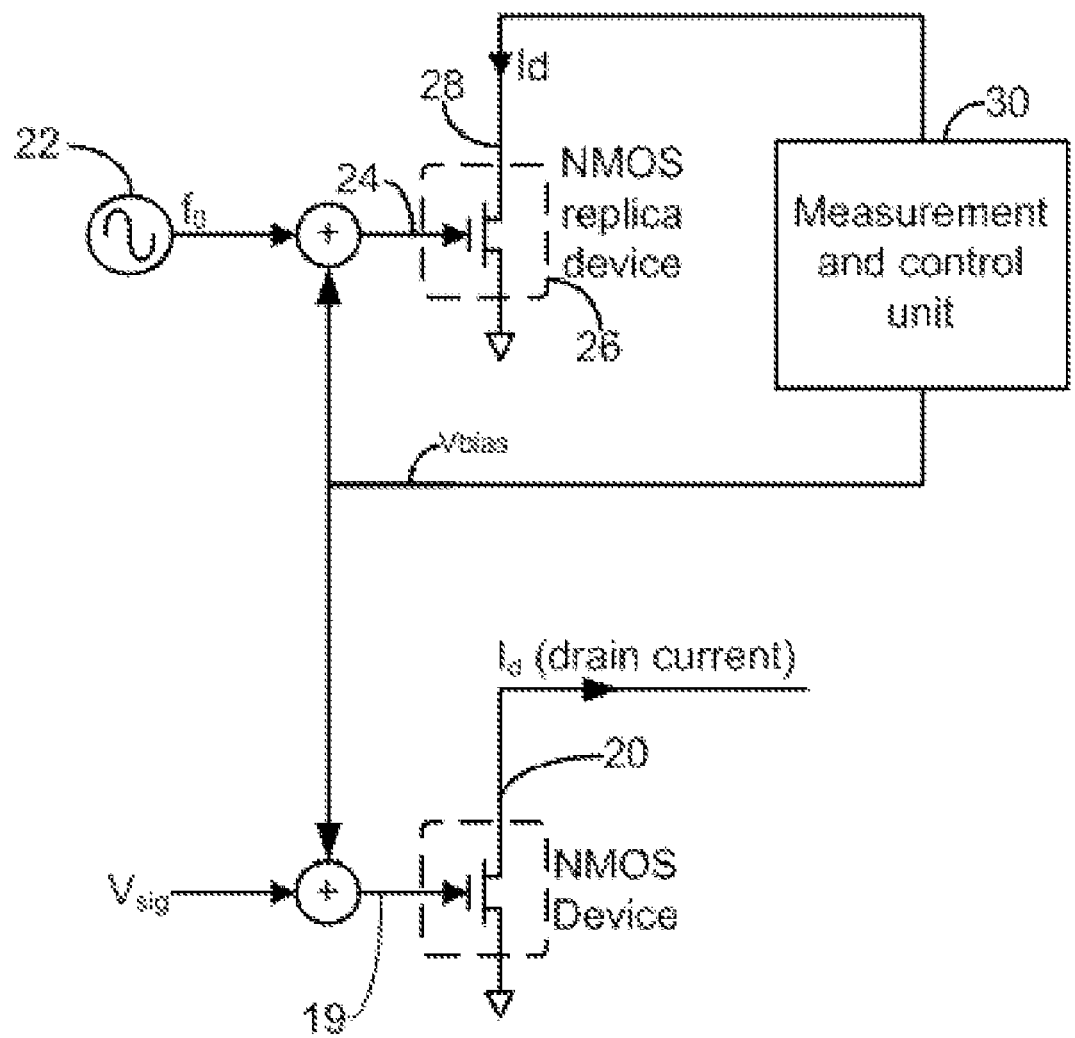
FIG. 2 shows a plot of the second order transconductance distortion coefficient for the device of FIG. 1.

The present invention provides a method and apparatus to adjust the bias voltage of the transistor for optimum linearity performance (i.e., at point A). FIG. 2 shows a block diagram of an embodiment of the present invention. In this figure, a CW source 22 is connected to a gate 24 of an NMOS replica device 26, which can be a replica of the NMOS device 20. The CW source 22 generates a signal of substantially constant amplitude and frequency, the frequency being denoted by $f_o$. An output signal is generated at a drain 28 of the NMOS replica device 26 and is received by a measurement and control unit 30 that measures a value of a distortion component of the output signal generated at the drain 28 and, in accordance with the measured value, supplies a bias voltage $V_{bias}$ for application at the gate 24 of the NMOS replica device 26 and at the gate 19 of the NMOS device 20, that produces a desired amount of distortion. In most cases, the bias voltage is determined through any suitable feedback loop approach, to minimize the distortion in question.

Figure 3:
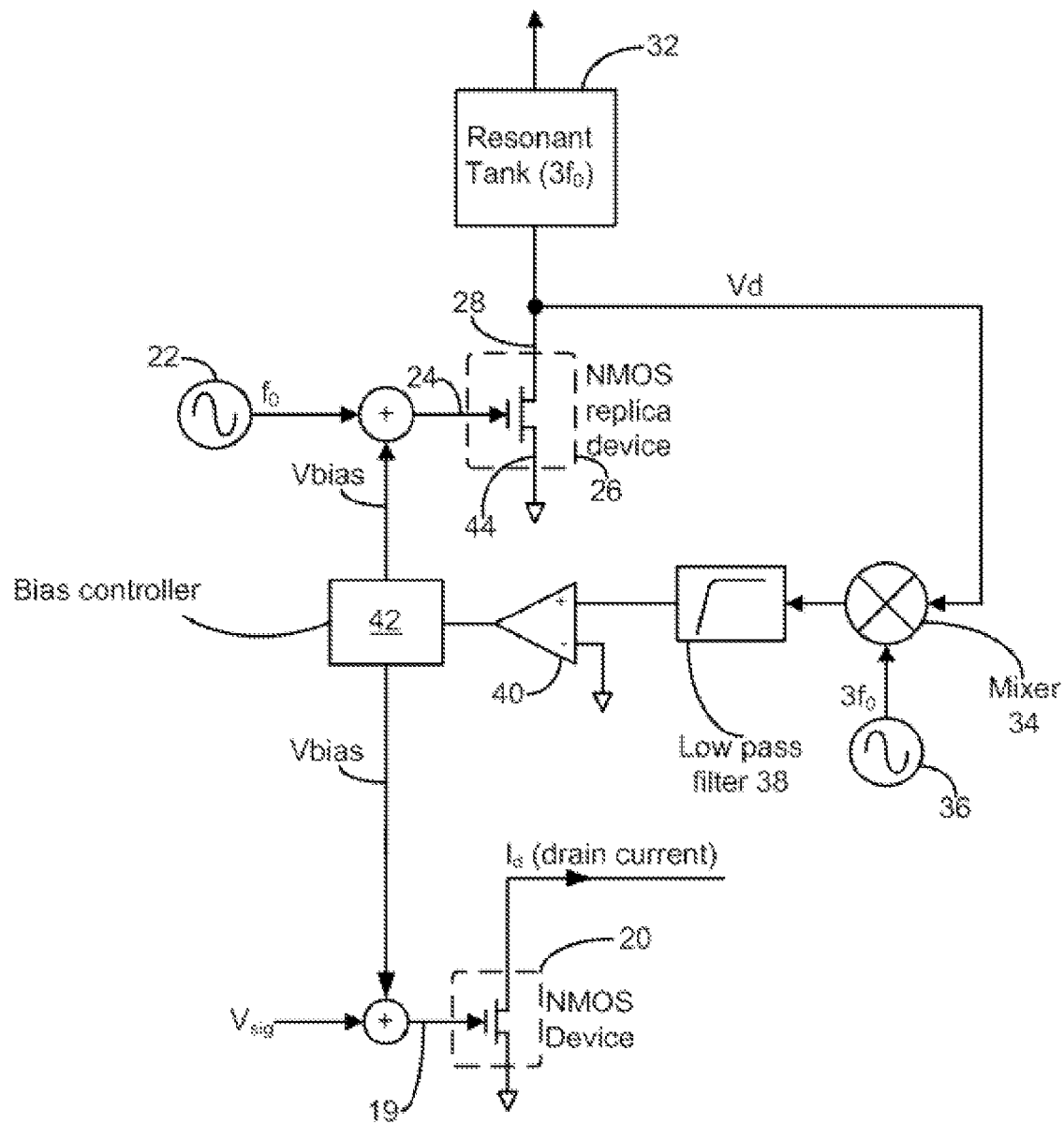
FIG. 3 shows a plot of the third order transconductance distortion coefficient for the device of FIG. 1.

FIG. 3 shows a more detailed embodiment of the present invention for minimizing third order distortion in the output signal of the NMOS device 20 of FIG. 2 by minimizing the same distortion in the output signal of the NMOS replica device 26. As in the embodiment of FIG. 2, the CW source 22 generates a signal of substantially constant amplitude and frequency, the frequency being denoted by $f_o$. In this embodiment, the drain current, i.e., the output signal, is converted to a voltage ($V_d$) by a resonant tank 32, which is centered at $3*f_0$ (third harmonic of input signal). This choice of center frequency for the resonant tank 32 attenuates all other frequency components, making the third harmonic the dominant frequency component of the output signal, i.e., in this embodiment, the dominant frequency component of $V_d$.

The voltage $V_d$ is then mixed at a mixer 34 with another CW signal, this one generated by a source 36 and having a frequency $3*f_0$. The mixer produces, amongst others, a voltage signal at a frequency of $6f_0$ and a DC voltage, which is proportional to the magnitude of the third harmonic present in $V_d$. A low-pass filter (LPF) 38 can be connected at the output of the mixer 34 to filter-out signal components other than the DC component.

The output of the LPF 38 is then compared to ground, which is also connected to the source 44 of the replica device 26, by means of a high gain amplifier 40. The output of the high gain amplifier 40 is connected to a bias controller 42 that adjusts the bias voltage $V_{bias}$ in accordance with the output of the high gain amplifier 40 and supplies the bias voltage in question to the gate 19 of the NMOS device 20 and to the gate 24 of the NMOS replica device 26. The manner in which the bias controller 42 set the bias voltage can be as follows. At the onset of a procedure for varying (minimizing) third order distortion in the NMOS device 20 (and in NMOS replica device 26), the bias controller 42 applies a pre-determined voltage. This can be a calculated voltage based on the design of the NMOS device 26 itself or it can be based on historical voltages for similar devices. Following this setting of bias voltage, the output at the high gain amplifier 40 is measured and stored in a memory of the bias controller 42. The bias voltage is then varied by the bias controller 42 and the output of the high gain amplifier 40 is measured again and compared to the stored value to obtain a comparison value. The bias controller 42 then uses this comparison value to further adjust the bias voltage in any suitable feedback manner to achieve the desired level of third order distortion. As will be understood by the skilled worker, the embodiments shown at FIGS. 2 and 3 can be made to track changes related to variations in the behavior of the transistor devices 20 and 26 (e.g., temperature variations).

The overall effect of the circuit of FIG. 3 is to drive $V_{bias}$ to a point such that the transistor produces the desired level (minimum) of third order. For a minimum value of third order distortion, it can be shown that this corresponds to a where the third order transconductance of the transistor in question is zero.

There are three main sources of nonlinear distortion in MOS transistors: (a) transconductance ($g_m$); (b) gate capacitances ($c_{gs}$, $c_{gd}$); and (c) junction capacitances ($c_{js}$, $c_{jd}$). Of the three sources, transconductance often dominates and the present invention with its exemplary embodiments above mitigates this transconductance effect. In a MOS transistor, transconductance is defined as:

$$g_m = \frac{\partial I_d}{\partial V_{gs}} \qquad \text{Eqn 1}$$

where $I_d$ is the drain current and $V_{gs}$ is the gate-source voltage. However, $g_m$ is not a linear function of $V_{gs}$, as shown in the following power series expansion of drain current:

$$I_d = a_1 V_{gs} + a_2 V_{gs}^2 + a_3 V_{gs}^3 \qquad \text{Eqn 2}$$

where $a_1 = g_m$, $$a_2 = \frac{\partial g_m}{\partial V_{gs}},$$

$$a_3 = \frac{\partial^2 g_m}{\partial V_{gs}^2}$$

where the terms $a_2$ and $a_3$ represent the second and third order transconductance distortion coefficients of the MOS transistor. As can be seen, the second order distortion is proportional to the first derivative of transconductance with respect to $V_{gs}$. Likewise, the third order distortion is proportional to the second derivative of transconductance with respect to $V_{gs}$.

Figure 4:
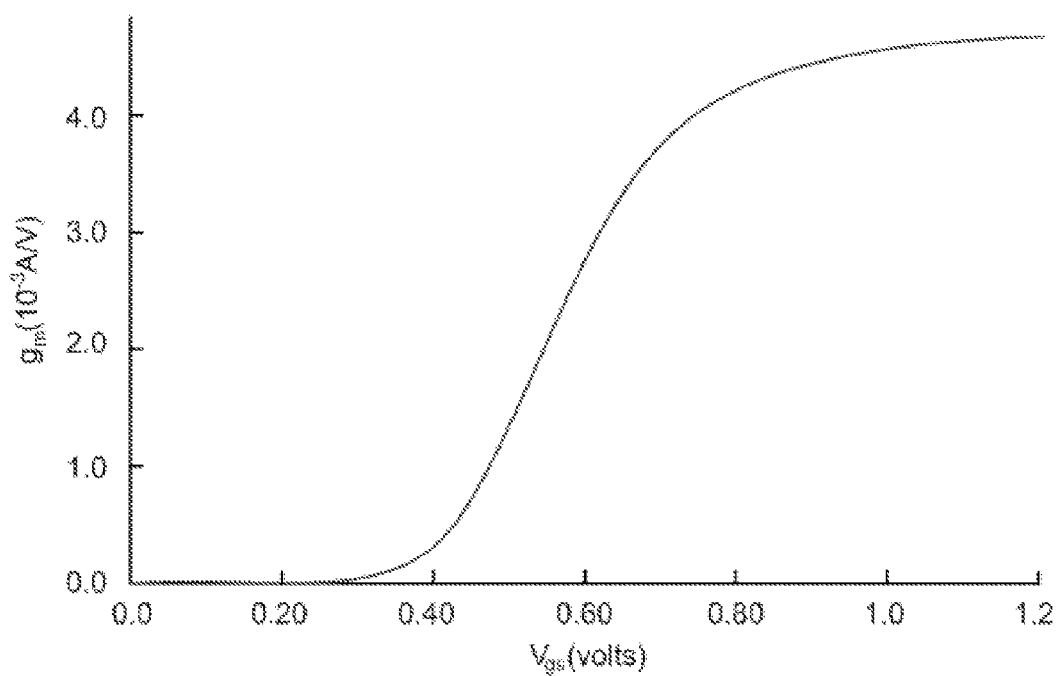
FIG. 4 shows an NMOS device having a signal voltage and a bias voltage applied to its gate.
Figure 5:
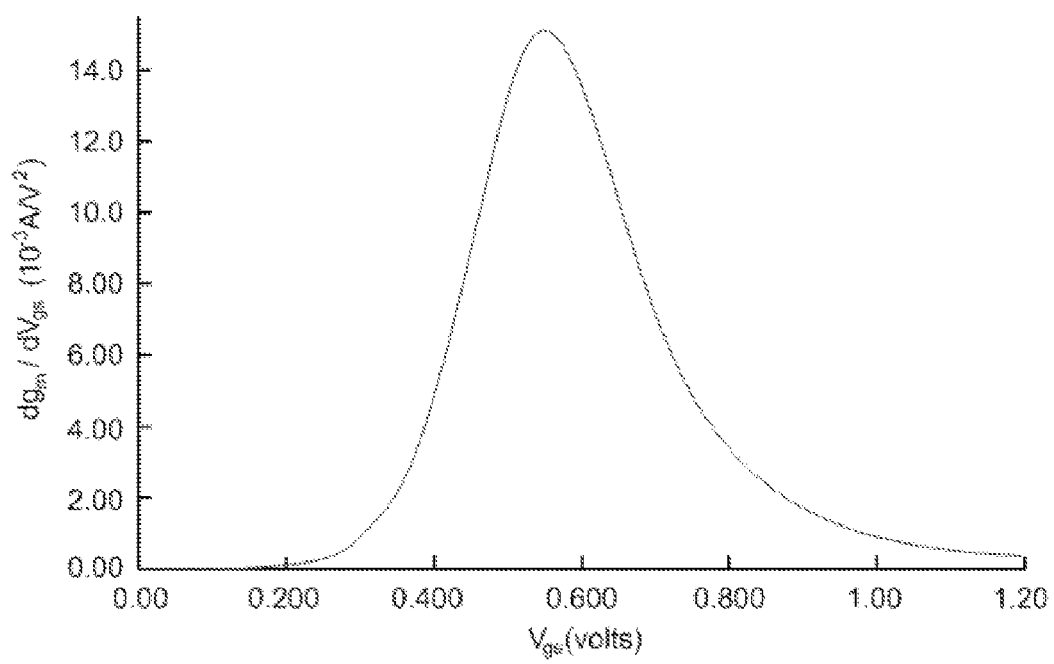
FIG. 5 shows an exemplary embodiment of a biasing circuit of the present invention.
Figure 6:
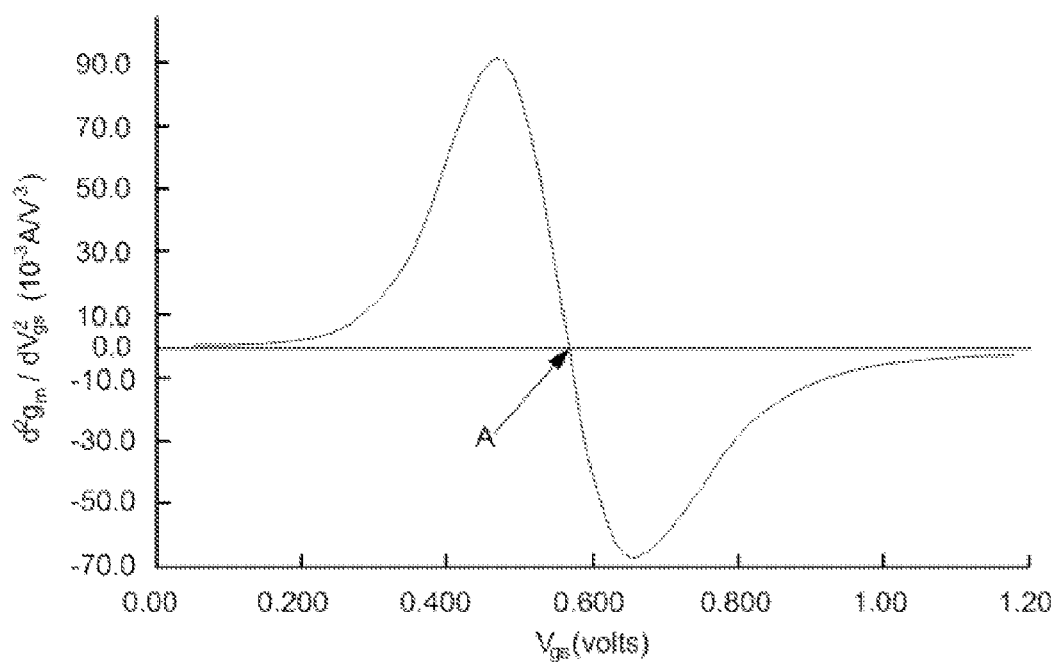
FIG. 6 shows another exemplary embodiment of a biasing circuit of the present invention.

The linear coefficient $a_1=g_m$, follows the trend depicted at FIG. 4, plotted for a typical MOS transistor device. The second order distortion coefficient $a_2$, for the device of FIG. 4, is shown at FIG. 5, and the related third order distortion, represented by coefficient $a_3$, is shown at FIG. 6. Most circuits solve the issue of even order distortion (e.g., second order distortion) by utilizing differential topologies. In those cases, the designer is left to deal with only odd order distortion, out of which third order typically dominates. For example, MOS transistors exhibit intrinsic non-linearities that degrade the performance of communication systems and the third order non-linearity is often the dominant factor in overall system distortion. The point "A" indicated by the arrow at FIG. 6 corresponds to zero third order distortion. Based on knowledge of the transconductance of a MOS transistor, it is possible to set $V_{bias}$ such that nonlinear distortion is minimized.

Referring to FIG. 6, as mentioned above, point A on the curve is a point at which third order distortion is zero. It may be noted that there are two other regions on the curve where third order distortion approaches zero: (a) at very low values of $V_{gs}$, and (b) at very high values of $V_{gs}$. Both of these bias conditions have disadvantages. In (a), the voltages are in the cutoff region in which very little gain can be obtained from the transistor. In (b) the voltages are in either the saturation or triode region (depending on $V_{ds}$), which lead to the dissipation of a large amount of power for a given amount of gain. Thus point A represents a better option where the device provides reasonable gain without dissipating excessive power.

It should be noted that as $V_{sig}$ increases in amplitude, the value of $\partial^2 g_m/\partial V_{gs}^2$ is pulled further away from the zero crossing at point A. However, as will be understood by a worker skilled in the art, biasing at point A does still leads to improvements in linearity, particularly at smaller amplitudes of $V_{sig}$.

As will be understood by the skilled worker, the invention described in relation to the embodiments shown at FIGS. 1 to 3 can be readily adapted to the situation where the input signal, $V_{sig}$, is a signal coded according to digital multi-carrier modulation scheme such as, for example, OFDM (Orthogonal Frequency-Division Multiplexing). In this case, the power at the output of the transistor and related to third order distortion (or any order of distortion) will be distributed between multiple tones, which can be minimized in whole or in part.

Figure 7:
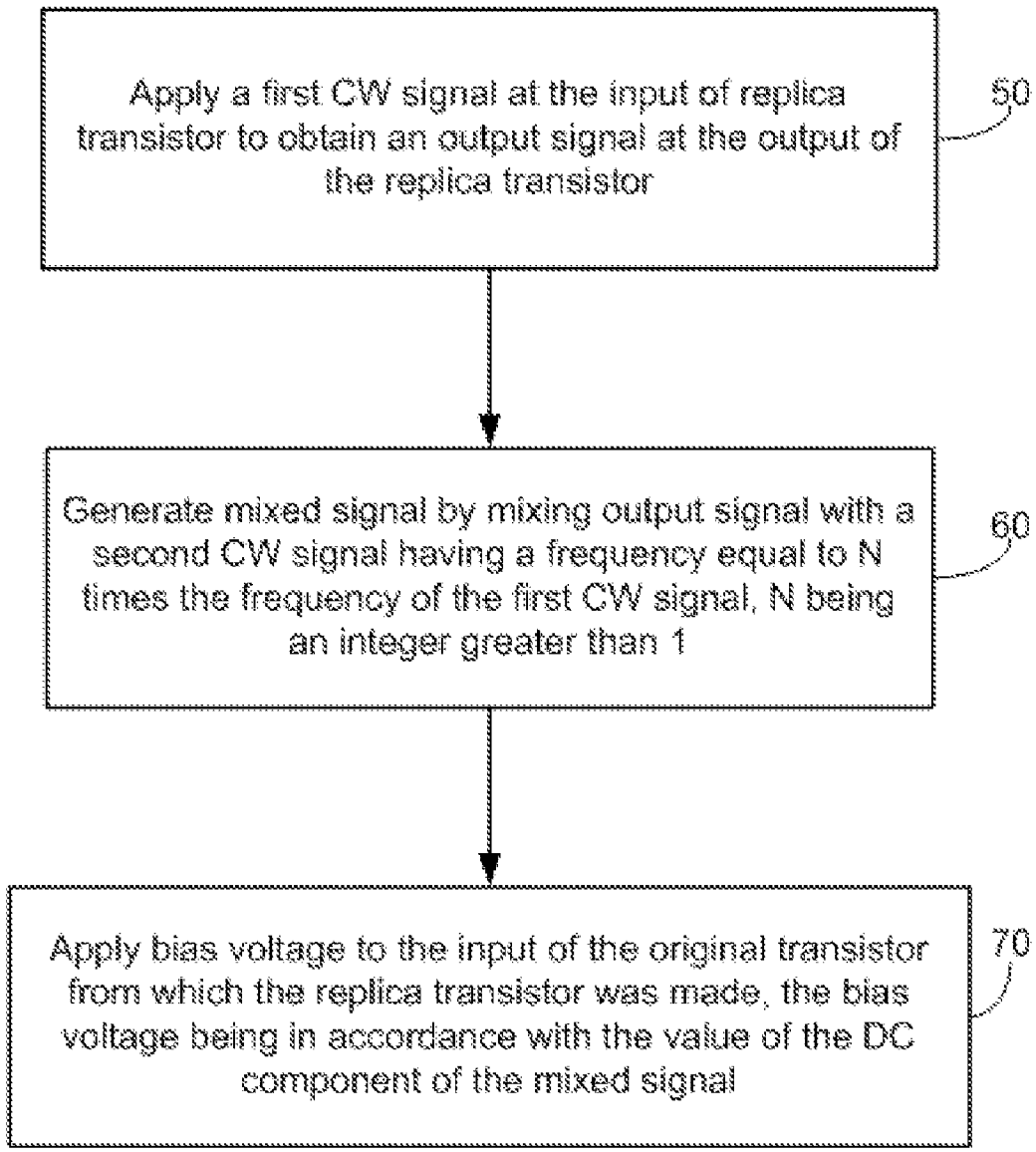
FIG. 7 shows an exemplary method of biasing a transistor circuit according to the present invention.

FIG. 7 shows a flowchart for an exemplary embodiment of a method of the present invention. At step 50, a first CW signal is applied at the input of a replica transistor to obtain an output signal at the output of the replica transistor. At step 60, a mixed signal is generated by mixing the output signal with a second CW signal having a frequency equal to N times the frequency of the first CW signal, N being an integer greater than 1. At step 70, a bias voltage is applied to the input of the original transistor on which the replica transistor was based, the bias voltage being in accordance with the value of a DC component of the mixed signal.

In the examples above, the transistor configuration is such that $V_{sig}$ and $V_{bias}$ are applied at the gate of an NMOS transistor and the output signal is generated at the drain of the NMOS transistor; however, as will be understood by the skilled worker, the present invention is also applicable to PMOS transistors and to other transistor configurations where any one of the three transistor ports (gate, source, drain) can serve as an input and any of the remaining two transistor ports can serve as an output. Further, as will be understood by the skilled worker, the above description can be readily adapted to the control of any order of distortion in transistor devices.

Generally, the invention described above provides a method and biasing circuit for minimizing $N^{th}$-order distortion in a working transistor circuit by adjusting the bias at the input of the working transistor. A first CW signal having a fixed frequency $f_o$ is provided at the input of a replica transistor circuit of the working transistor circuit to obtain an output signal at the output of the replica transistor circuit. The output signal is mixed with another CW signal having a frequency equal to $N*f_o$. The resulting mixed signal includes a DC component having an intensity proportional to the amount $N^{th}$-order distortion present in the output signal. A feedback circuit adjusts the bias at the input of the replica transistor circuit, and at the input of the working transistor circuit, to minimize DC component of the mixed signal.

In the above description, for purposes of explanation, numerous details have been set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A biasing circuit for varying distortion in a first transistor, the biasing circuit comprising:
   a replica of the first transistor;
   a first continuous wave (CW) source for providing a first CW signal at an input of the replica transistor to obtain an output signal at an output of the replica transistor, the first CW signal having a frequency $f_o$, the output signal having an $N^{th}$-order distortion component at a frequency $N*f_o$, N being an integer greater than one;
   a second CW source for generating a second CW signal having a frequency $N*f_o$;
   a mixer for mixing the output signal with the second CW signal to obtain a mixed signal having a DC component with an intensity proportional to a value of the $N^{th}$-order distortion component; and
   a bias controller for receiving the mixed signal and for biasing the input of the first transistor in accordance with the value of the $N^{th}$-order distortion component.

2. The biasing circuit of claim 1 further comprising a first filter connected to the output of the replica transistor, the first filter for filtering-out from the output signal components at frequencies other than $N*f_o$.

3. The biasing circuit of claim 2 further comprising a second filter for receiving the mixed signal and for attenuating components of the mixed signal other than the DC component.

4. The biasing circuit of claim 3 wherein the first filter is a resonant tank filter and the second filter is a low pass filter.

5. The biasing circuit of claim 1 further comprising an amplifier for amplifying the mixed signal prior to the mixed signal being received by the bias controller.

6. A method of setting a bias voltage in a transistor circuit, the method comprising steps of:
- in a replica transistor circuit of the transistor circuit,
  - applying a continuous wave (CW) signal at an input of the replica transistor circuit to obtain an output signal at an output of the replica transistor circuit, the CW signal having a frequency $f_o$;
  - determining, at the output of the replica transistor circuit, a value of an $N^{th}$-order distortion component of the output signal, the $N^{th}$-order distortion component being at a frequency equal to $N*f_o$, N being an integer greater than one; and
- in the transistor circuit, applying a bias voltage at an input of the transistor circuit in accordance with the value of the $N^{th}$-order distortion component.

7. The method of claim 6 wherein the step of determining is preceded by a step of, at the output of the of the replica transistor circuit, filtering-out from the output signal components at frequencies other than the frequency equal to $N*f_o$.

8. The method of claim 7 wherein the step of determining includes a step of mixing the $N^{th}$-order distortion component with a CW signal having a frequency equal to $N*f_o$ to obtain a mixed signal having a DC component with an intensity proportional to the value of the $N^{th}$-order distortion component.

9. The method of claim 8 wherein the step of mixing is followed by a step of filtering-out from the mixed signal, components other than the DC component.

10. The method of claim 6 wherein N is an odd integer.

11. The method of claim 10 wherein N is equal to 3 or 5.

12. The method of claim 6 further comprising a step of applying the bias voltage at the input of the replica transistor circuit and additional steps of:
- determining, at the output of the replica transistor, the value of the $N^{th}$-order distortion component of the output signal;
- verifying if the value of the $N^{th}$-order distortion component is within a pre-determined range; and
- if the value of the $N^{th}$-order distortion component is not within a pre-determined range, adjusting the bias voltage.

13. The method of claim 6 wherein the transistor circuit and the replica transistor circuit include metal-oxide-semiconductor (MOS) transistors.

14. The method of claim 6 wherein the transistor circuit and the replica transistor circuit are either bipolar junction transistors or metal-semiconductor field effect transistors.

15. The method of claim 6 wherein the inputs of the transistor circuit and the replica transistor circuit are gates and the outputs of the transistor circuit and of the replica transistor circuit are one of drains and sources.

16. The method of claim 6 wherein the inputs of the transistor circuit and of the replica transistor circuit are drains the outputs of the transistor circuit and of the replica transistor circuit are one of gates and sources.

17. The method of claim 6 wherein the inputs of the transistor circuit and the replica transistor circuit are sources and the outputs of the transistor circuit and of the replica transistor circuit are one of gates and drains.

18. A method for varying distortion in a transistor, the method comprising steps of:
- applying a continuous wave (CW) signal at an input of the transistor to obtain an output signal at an output of the transistor, the CW signal having a frequency $f_o$;
- determining, at the output of the transistor, a value of an $N^{th}$-order distortion component of the output signal, the $N^{th}$-order distortion component being at a frequency equal to $N*f_o$, N being an integer greater than one; and
- applying a bias voltage at the input of the transistor in accordance with the value of the $N^{th}$-order distortion component.

19. The method of claim 18 wherein N is an odd integer.

20. The method of claim 19 wherein N is equal to 3 or 5.

* * * * *